United States Patent [19]

Tonooka et al.

[11] Patent Number: 5,308,256

[45] Date of Patent: May 3, 1994

[54] SOCKET

[75] Inventors: Takashi Tonooka, Susono; Masahiro Fuchigami, Gotenba, both of Japan

[73] Assignee: Texas Instruments Incorporated, Dallas, Tex.

[21] Appl. No.: 984,768

[22] Filed: Dec. 3, 1992

[30] Foreign Application Priority Data

Dec. 27, 1991 [JP] Japan .................................. 3-358641

[51] Int. Cl.$^5$ .......................................... H01R 13/635
[52] U.S. Cl. ..................................... 439/266; 439/73
[58] Field of Search ..................................... 439/70–73, 439/259, 260, 261, 264, 266, 267, 330, 331

[56] References Cited

U.S. PATENT DOCUMENTS

| 4,887,969 | 12/1989 | Abe | 439/73 |
| 5,076,798 | 12/1991 | Uratsuji | 439/266 |
| 5,108,302 | 4/1992 | Plaff | 439/266 |

OTHER PUBLICATIONS

Patent Application Filed Aug. 28, 1992-Title "Socket", Inventors Ikuo Mori and Kiyokazu Ikeya-having Ser. No. 07/937,627 (our Docket No. A18729), assigned to the Assignee of this instant application.

*Primary Examiner*—Larry I. Schwartz
*Assistant Examiner*—Hien D. Vu
*Attorney, Agent, or Firm*—Russell E. Baumann; Richard L. Donaldson; René E. Grossman

[57] ABSTRACT

A socket for use in mounting of an electrical part with lead members has a main base member with contact elements secured therein and a reciprocating cover member movable up and down with respect to said base member and including a cam member adapted to engage said contact elements so that as said cover member moves from a first original position to a second position and back again the contact elements likewise move from the first position to a second position and then back again to the first position. This movement allows the insertion of the electrical part into the socket and the contacting of the contact elements with the lead members. The base member further includes at least 2 surfaces positioned along with a mounting surface so that the electrical part when mounted is guided into proper mounting position and maintains this position after contacting by contact members so that accurate contacting can be made between the contact elements of the socket and the terminal parts of the electrical part without the need of a latch mechanism.

14 Claims, 7 Drawing Sheets

SOCKET

BACKGROUND OF THE INVENTION

This invention relates to a socket having a contact for making contact to electrical part and more particularly to a socket for use in an IC chip test.

In recent years, the IC package has become thinner and smaller thereby increasing the demand for surface mounting of them. At the same time, however, the quality of the product becomes potentially less stable as the IC becomes thinner with the consequence that it has become even more important to testing and elimination of those products which do not pass test or which contain an element that does not pass test.

To accomplish such testing the IC package is placed in a heating furnace (heat-resistant test called burn-in test) in a socket. Such a socket for IC package mounting as used in such a test is shown in FIG. 15.

The IC package 16 as shown in FIG. 15 is of the vertical surface mount package type (VPAK), whereby a lead 18 is provided only on one side of the IC chip so as to be mounted vertically on the substrate as shown in FIG. 11, 12 and 13.

Protrusions 17a are provided at both ends of the main body 17 on the side with contact leads 18. Additionally, the leads 18 have a tip portion 18a bent by nearly 90 degrees with regard to the main portion of lead 18. FIG. 14 clearly shows this feature. The IC package 16 is mounted vertically in application on a printed substrate which is indicated by an imaginary line in FIG. 12. In this mounted state, the protrusion 17a are inserted into the blind holes 80a of the printed substrate 80, with the IC package 16 being positioned with regard to printed substrate 80 so that the bend part 18a at the tip of lead 18 is soldered to the wiring 80b of the printed substrate 80. In connection with the burn-in test, however, the IC package 16 is horizontally mounted as shown in FIG. 15.

FIG. 15 shows an expanded cross section of a typical socket with an IC package mounted therein. The socket consists of a main socket body (base) 81 which is equipped with a contact and a cover 90. The cover is biased in a direction which is opposite to the base 81 by means of a coil spring 98 and it is stopped at a prescribed location as compared with base 81 by means of a stopper as is known in the art and not shown in the drawing.

The IC package 16 is inserted into an IC package insertion space 81a of base 81 and positioned on a placing surface 81c of a placing stand 81b. Contact 95 has a base part 95a contained in the bottom wall of base 81, a terminal portion 95f which sticks out beneath the base and a pin part 95b which extends up into the space inside the base. Attached to pin part 95b is a curved portion 95c which terminates in a tip which compressively contacts the bent portion at the tip of lead 18 due to the elasticity of the pin part 95b.

In the above described socket, the lead 18 exists only on one side of the main IC package with a result that the main IC package body 17 tends to jump out upwardly by moving as indicated by arrow mark b by the compressive force due to the contact 95 as indicated by an arrow mark a.

It is possible to employ a latch mechanism and fix the position of the IC package by using it. However, the use of such a latch will complicate the structure of the socket and thereby increase its manufacturing cost.

SUMMARY OF THE INVENTION

The socket of the present invention provides a guiding and positioning means for guiding at least two mutually facing main surfaces of an electrical part to be mounted in said socket so that the electrical part is positioned and fixed in the main socket body at an accurate position without moving after mounting. As a result of this accurate and fixed positioning, the connection between the terminal part of the electrical part and the contact member in the socket are accurately connected for high reliability in the testing. Further, there is no need to separately provide a mechanism for the positioning and fixing of the electrical part.

It is an object of the present invention to provide a socket of high reliability, simple structure and low cost in which the mounted electrical parts are stably and accurately positioned in the main socket body.

Briefly described, the socket of this invention comprises a socket for mounting an electrical part with lead members for use in a burn-in test of the electrical part comprising a base member, resilient contact element means secured in said base member adapted to make contact with the lead members of said electrical part, a reciprocating cover means capable of reciprocating motion in respect to said base member, said reciprocating cover means having a cam means adapted to be in contact with said contact element means such that as said reciprocating cover means moves from a first position to a second position for mounting said electrical part said cam means causes said contact element means also to move from a first original position to a second electrical part mounting position, and upon said reciprocal motion member returning to said original position said contact means also moving back to said original position from said second position thereby providing electrical contacting between said terminal leads and said contact element means and means formed within said base member for precisely guiding and positioning said electrical part during mounting in said socket and for holding said electrical part after mounting to ensure reliable contacting.

DESCRIPTION OF THE DRAWINGS

Other objects, advantages and details of the socket of this invention appear in the following detailed description of preferred embodiments of the invention, the detailed description referring to the drawings in which.

DETAILED DESCRIPTION OF THE PREFERRED EMBODIMENTS

Figure 1:
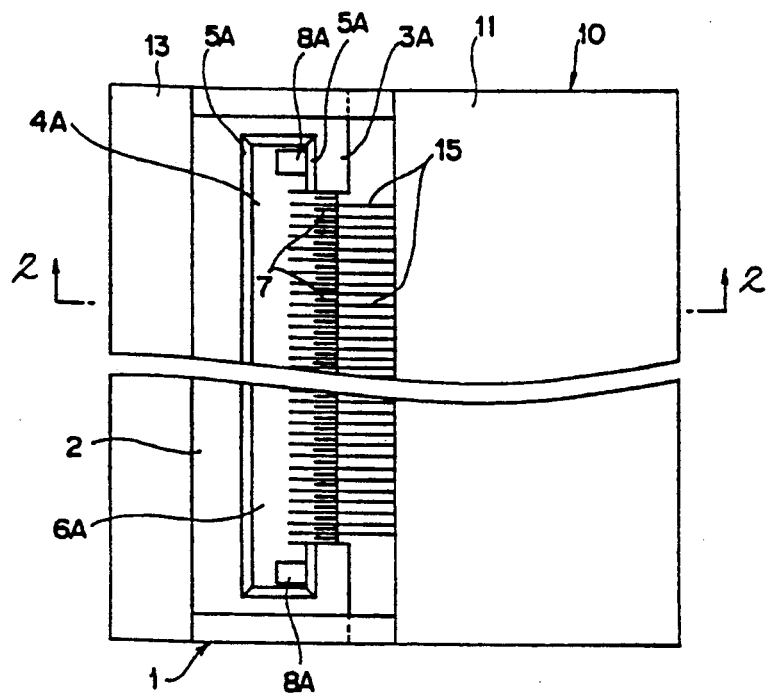
FIG. 1 is an expanded plane figure of the socket of the present invention (Example 1)

This invention will be described by referring to the drawings showing the embodiments (Examples 1-6). Embodiments 1-5 are examples of a socket for the burn-in test where the IC package of the VPAK type is mounted.

Figure 2:
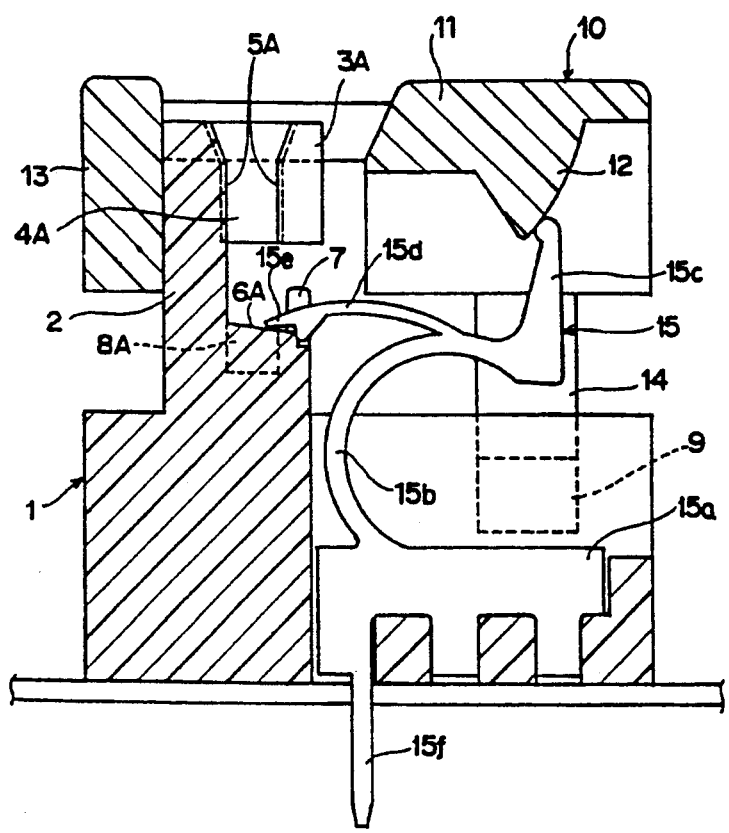
FIG. 2 is a cross-section cut along line 2—2 of FIG. 1.
Figure 3:
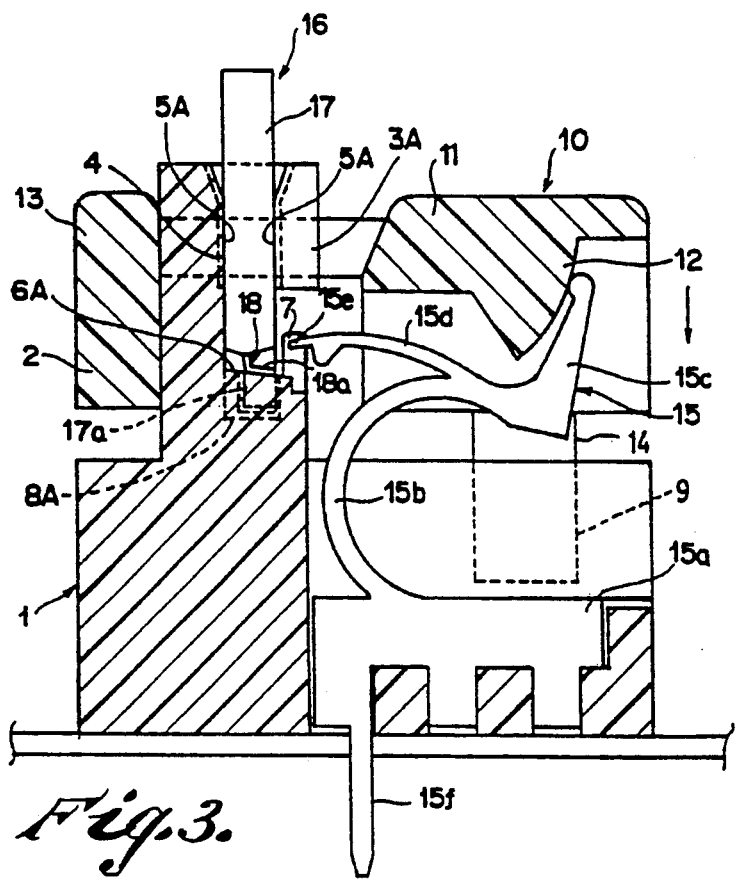
FIG. 3 is a cross-section view similar to FIG. 2 in which an IC package is mounted in the socket.

The first embodiment (Example 1) set forth in FIGS. 1-3 shows a socket 10 having a base 1, a cover 10 and a large number of contacts 15.

A base part 15a of contact 15 is buried and fixed in the bottom wall of base 1 with a downwardly protruding terminal 15f and an upwardly protruding curved part 15b from base part 15a. Extending upward from one end of curved part 15b is a contact piece 15c and extending at right angle from the contact piece 15c is a lead holding part 15d for making contact with the lead of an electrical part/IC package 16. At the tip of the lead holding part 15d, there is provided a tip contact part 15e which actually contacts the lead of the IC package 16. The curved part 15b and the lead holding part 15d have preselected spring property characteristics and both of them are biased in the counterclockwise direction as shown in FIG. 2.

Both ends of the side wall 2 of base 1 are shaped like a "U" (FIG. 1) and a mounting space 4A for mounting the IC package main body is formed between the inner wall 3A and the side wall 2. The surfaces which are opposite to the side wall 2 and inner wall 3A constitute guiding and positioning surfaces 5A for guiding the package at the time it is mounted and for positioning after mounting.

Figure 11:
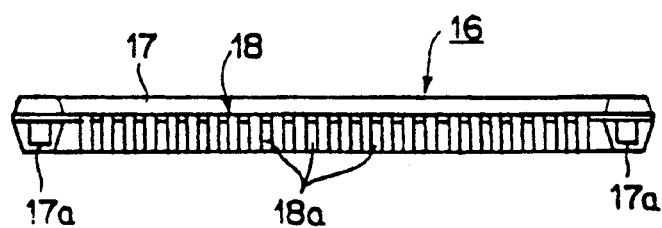
FIG. 11 is an expanded plane view of an IC package of the VPAK type.
Figure 12:
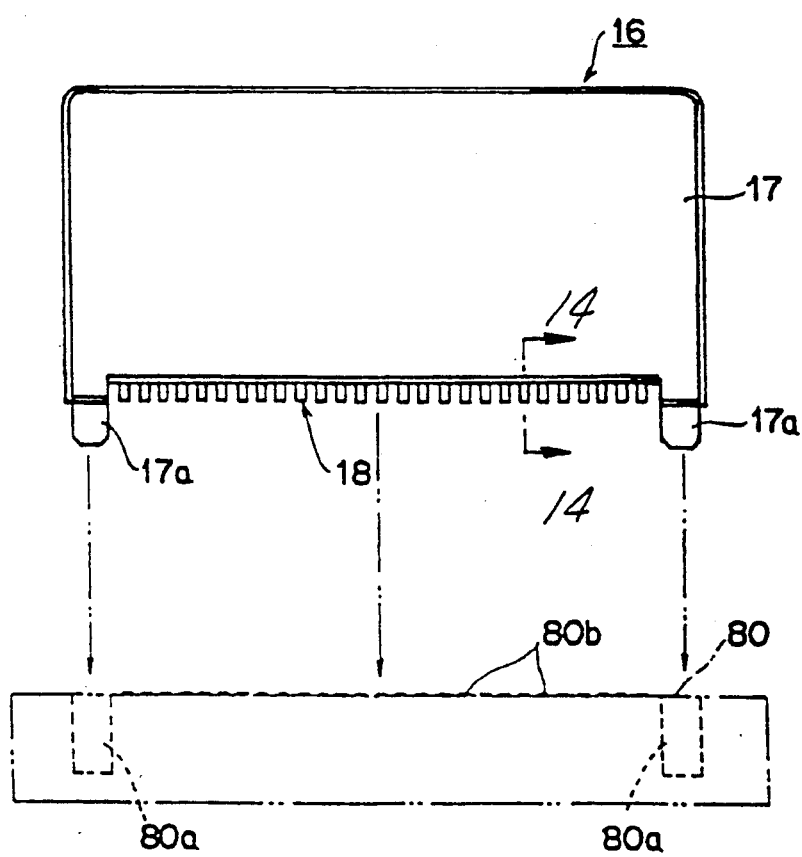
FIG. 12 is an expanded front view of the IC package of FIG. 11.
Figure 13:
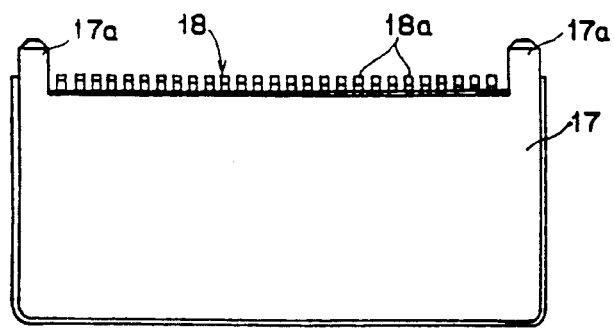
FIG. 13 is an expanded back view of the IC package of FIG. 12.
Figure 14:
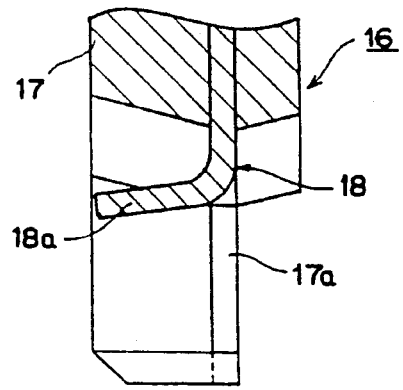
FIG. 14 is an expanded cross-section cut along line 14—14 of FIG. 12.
Figure 15:
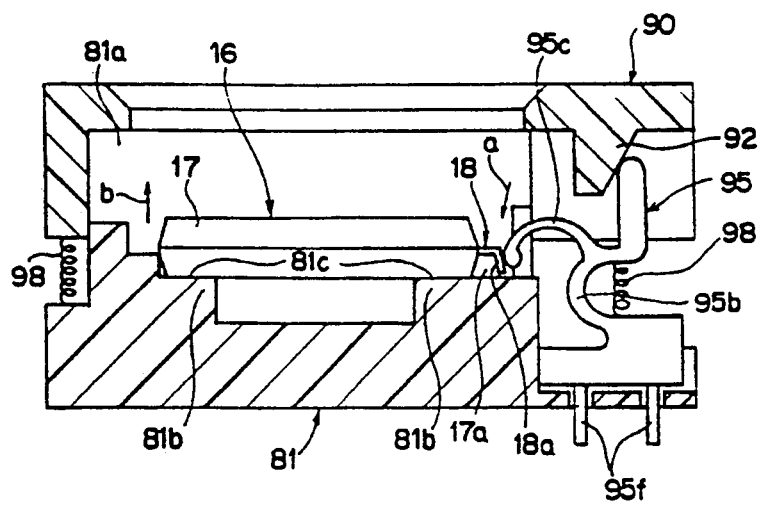
FIG. 15 is an expanded cross-section of a prior art socket in which an IC package is mounted in the socket.

Below the mounting space 4A, there is provided a contact surface 6A which contacts the tip of the lead of the IC package, and, at both ends of the contact surface 6A, there are provided blind holes 8A (reference should be made to FIGS. 11-13) of the IC package main body.

From the contact side of the contact surface 6A, a large number of thin partition walls 7 are erected like the teeth of a comb for preventing the contacting between neighboring lead holding parts in connection with the movement of the lead holding parts 15d of the contact.

The cover 10 with central aperture comprises a top wall 11 having a cam part 12 facing down a side wall 13 which contacts the base side wall 2 in such a way as is slidable. As shown in FIGS. 2 and 3, the tip of the contact piece 15c of contact 15 is in contact with the cam part 12 and is biased counter-clockwise (moves clockwise) as it rides up the cam surface 12 as the cover 10 is pushed down. That is, upon the downward movement of cover 10, lead holding part 15d is moved in a general direction away from contact with contact surface 6A and upon removal of this downward force, the contact will move back to its original position. Additionally, there is a stop means (not shown) which restricts the upward movement of cover 10, but such stop means allows for the movement of the lead holding part to move back to a position in contact with contact surface 6A.

Typically, base 1 and cover 10 are made from elastomeric materials such as polyether imide or aromatic polyester resin and the contact 15 is made of spring material such as beryllium bronze/copper.

The IC package is mounted on the socket in the following manner:

First, the cover 10 is lowered from the state shown in FIG. 2 towards base 1 as shown in FIG. 3. Upon this movement the cam part 12 moves downward and the tip of the contact piece 15c of contact 15 rotates to the right (as shown in these figures) thereby elastically deforming curved part 15b in a clockwise direction with the consequence that the lead holding part 15d rotates slightly in the clockwise direction. In this state, the tip contact part 15e of the contact moves upward to the right, thereby vacating the mounting space 4A at the mounting time of the IC package.

Next, the IC package 16 is mounted in the insertion space 4A. At this juncture, both of the main surfaces of the main body 17 of the IC package are guided by the guiding and positioning surfaces 5A of the base and the protrusion 17a is inserted into the blind hole 8A and, at the same time, the tip bent part 18a of the lead 18 is placed on the contact surface 6A of the base. In addition, the main IC package body 17 is positioned by the guiding and positioning surfaces 5A.

Figure 4:
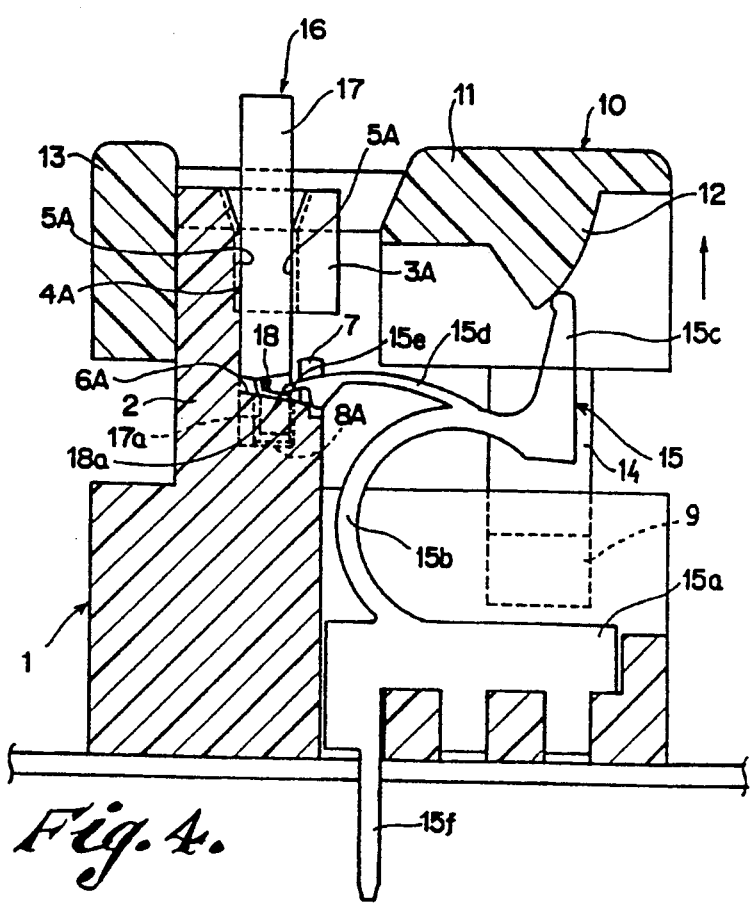
FIG. 4 is a cross-section view of FIG. 3 showing the state subsequent to the mounting of the IC package.

When the force holding the cover down is lifted, the cover rises to its original position as shown in FIG. 4 by the force of the bent part 15b of the contact. In addition, contact 15 is generally restored to its original shape, and the tip contact part 15e of the lead holding part 15d makes contact with bent part 18a at the tip of the lead 18 of the IC package.

The electrical connection is reliably made as the tip contact part 15e holds the lead tip bent part 18a onto the contact surface 6A by the spring force from bent part 15b and lead holding part 15d. In this manner the lead 18 of the IC package is electrically connected to the contact terminal part 15f through the lead holding part 15d, curved part 15b and the base part 15a of the contact.

The procedure opposite to what has been described above will take place to remove the IC package from the socket.

Since the IC package 16 is accurately positioned and fixed by the guiding and fixing surface 5A and the contact surface 6A and the blind hole 8A as described above, the electrical connection is reliably made. In addition, such an IC package fixing and positioning mechanism such as a latch, etc., is not required for the socket with the result that its structure becomes simple and its manufacturing cost is low.

In the above example, the IC package is vertically mounted in the socket. However, the mounting direction of the IC package as compared with the socket can be different. Such embodiment/examples will be explained below on the basis of FIGS. 5 through 8 as was the case with regard to FIG. 4.

In these new embodiments, reference numerals used in the description of the first embodiment (A) will be the same for similar items.

EXAMPLE 2

Figure 5:
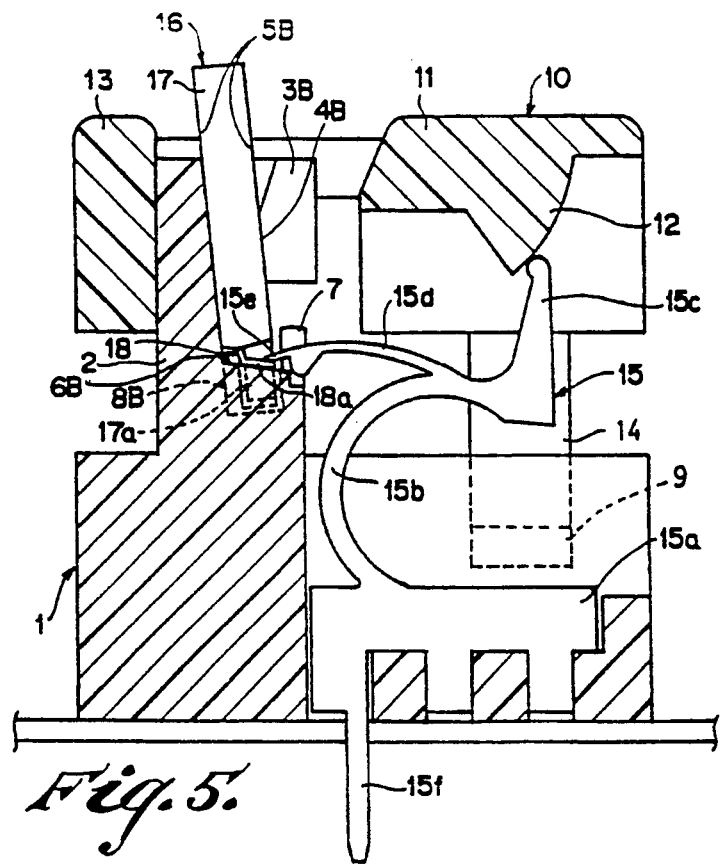
FIG. 5 is an expanded cross-section of the socket of a second embodiment (Example 2) of the present invention in which the IC package has been mounted.

In this embodiment (B), as shown in FIG. 5, the lower parts of the IC package mounting space 4B, guiding and positioning surfaces 5B and the blind hole 8B are inclined somewhat toward the side of cam part 12 as going from top to bottom in the figure. Additionally, the lead contact surface 6B is made approximately horizontal (with the right side slightly higher than in the example shown in FIG. 4). Other parts and numbers of this embodiment are the same as above mentioned for the first embodiment (Example 1).

EXAMPLE 3

Figure 6:
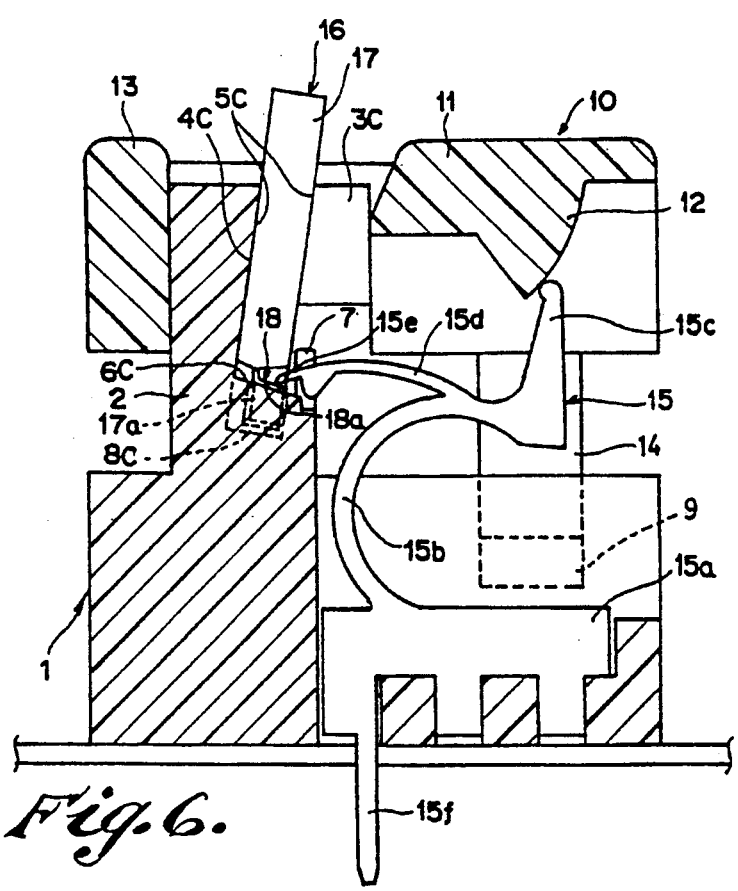
FIG. 6 is an expanded cross-section of the socket of a third embodiment (Example 3) of the present invention in which the IC package has been mounted.

In this embodiment (C) as shown in FIG. 6, the lower parts of the IC package mounting space 4C, guiding and positioning surfaces 5C and blind hole 8C are inclined away from the side of the cam part 12 as going from top to bottom in the figure. Additionally, the lead contact surface 6C is positioned lower toward the right than as shown in FIG. 4. Other parts and numerals of this embodiment are the same as above mentioned for the first embodiment (Example 1).

Since the IC package is mounted either vertically or nearly vertically as compared with the base in Examples 1, 2 and 3, there is an added effect of making it possible to reduce the size of the socket as compared with the conventional socket which is mounted horizontally.

EXAMPLE 4

Figure 7:
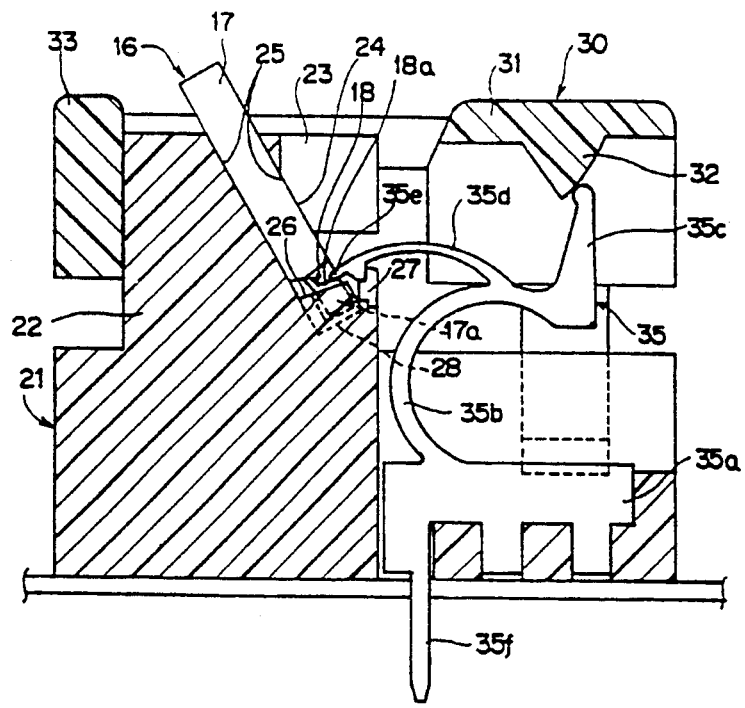
FIG. 7 is an expanded cross-section of the socket of a fourth embodiment (Example 4) of the present invention in which the IC package has been mounted.

In this example as shown in FIG. 7, the incline angles of the IC package mounting space 24, guiding and positioning surfaces 25 and blind hole 28 are somewhat larger (approximately 30 degrees) than the aforementioned Example 2 (FIG. 5), with the lead contact surface 26 being elevated toward the right. As a result of this design, there is a need to increase the width of the base 21. Therefore, the thickness of side wall 22 has been made larger and the side wall 33 of the cover 30 is correspondingly located adjacent side wall 22. In addition, the lead holding part 35d of the contact 35 is curved to a greater degree than in the earlier examples.

In this example, there is less miniaturization of the socket but the other advantages obtained are the same as those described in Example 1 above.

EXAMPLE 5

Figure 8:
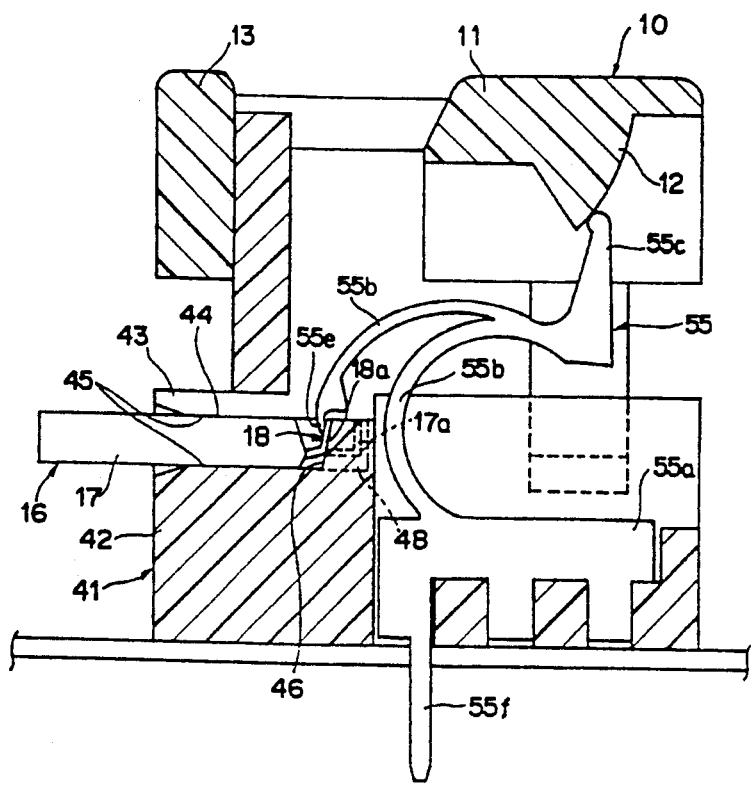
FIG. 8 is an expanded cross-section of the socket of a fifth embodiment (Example 5) of the present invention in which the IC package has been mounted.

In this example as shown in FIG. 8, an IC package is provided horizontally between the bottom wall 42 and inner wall 43 of the base 41. The guiding and positioning surfaces 45 and blind hole 48 are made horizontal and the lead contact surface 46 is a surface which is slightly inclined to the right from the vertical as is shown in FIG. 8. The IC package is mounted from the left side as shown in the figure. The shape of the contact 55, the lead holding part 55d is curved to a greater degree than in the various contact designs so that the lead holding tip part 55e may become near vertical. The other parts of the socket are the same as in Example 1.

EXAMPLE 6

This is an example showing a socket for the burn-in test where an IC package of the so-called flat surface mount package (FPAC) type, with a large number of leads being provided on mutually facing two sides of the IC chip is mounted.

Figure 9:
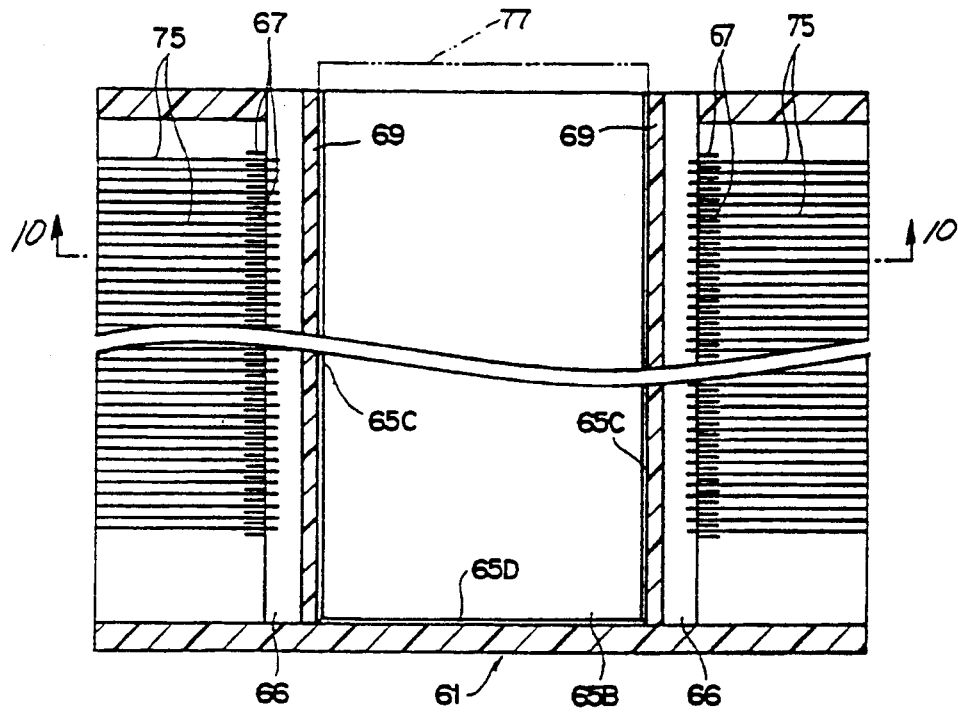
FIG. 9 is an expanded plane figure of the socket of a sixth embodiment (Example 6) of the invention (cross section cut along line 9—9 in FIG. 10.)
Figure 10:
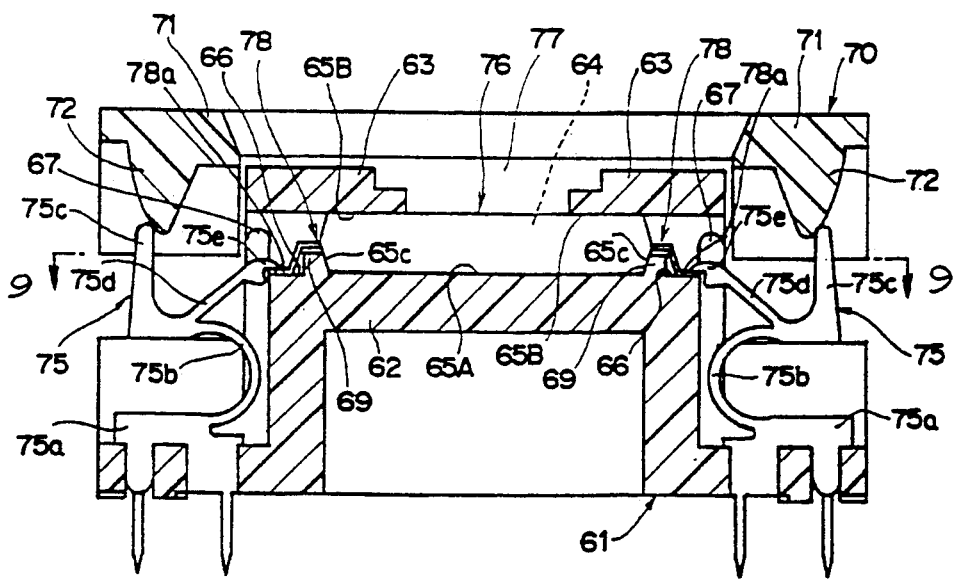
FIG. 10 is a cross-section cut along line 10—10 in FIG. 9.

FIGS. 9 and 10 show an enlarged socket of this embodiment. FIG. 9 is a cross-section cut along line 9—9 in FIG. 10, and FIG. 10 is a cross-section cut along line 10—10 in FIG. 9. In addition, FIG. 10 shows the state in which an IC package has been mounted. In FIG. 9, the main body 77 of an IC package is shown by an imaginary line.

An IC package mounting space 64 is formed between the bottom wall center 62 and the upper walls 63 of the base 61. The surfaces facing this space 64 become the guiding and positioning surfaces 65A, 65B on the bottom and top sides respectively of the IC package. There are provided filamentary protrusions 69 in contact with both ends of the guiding and positioning surface 65A of the bottom wall center 62, with the opposite inclined surfaces of the protrusions 69 becoming the other guiding and positioning surfaces 65C as clearly shown in FIG. 10.

65D in FIG. 9 is provided at the bottom wall center 62 and it is a positioning surface for positioning one side without the lead provision of the IC package main body 77.

The IC package 76 is horizontally mounted from the side into the IC package mounting space 64 of the base 61.

The mutually facing two sides of the main body 77 of the IC package 76 have a large number of leads 78 provided thereon, with the lead 78 being bent at two locations and the lead 78 has the tip bent parts 78a placed on the lead contact surfaces 66 which have been provided at the bottom wall center 62 in such a manner as to be astride over the protrusions 69.

Cam parts 72 are provided at the bottom and top portions 71 at the right and left of the cover 70 and the contacts are provided in such a way as to face each other at the right and at the left and the tips of the contact pieces 75c of the contacts 75 contact the cam parts 72.

In the drawing, 75a indicates the base part of the contact, 75b is the bent part of the same, 75d is the lead holding part of the same, 75e is the tip of the same, 75f is the terminal of same and 67 is the partition walls which have been provided like the teeth of a comb on the base 41.

The base 41, cover 70 and IC package 76 are symmetrical between the right and left and the contacts 75 move in the same manner as described in each of the aforementioned examples by the vertical movement of the cover 70 as shown in FIG. 10.

In this example, too, the main IC package body 77 is accurately positioned and fixed by the guiding and positioning surfaces 65A, 65B, and 65C, and the position-fixing surfaces 65D as in each of the aforementioned examples, and the various leads 78 are accurately connected to the various contacts 75.

In accordance with the socket of this invention, a guiding and positioning surface is provided for guiding at least two mutually facing main surfaces of an electrical part to be mounted in addition to positioning and fixing the part so that the electrical part is positioned and fixed in the main socket body at an accurate position without moving after mounting. As a result of this, the connection terminal part of the electrical part and the contact are accurately connected and reliability becomes high due to accurate electrical connection.

Further, there is no need to separately provide a mechanism for the positioning and fixing of the electrical part. Accordingly, the structure can be simple and its manufacturing cost will be low.

The examples of this invention have been shown above. It is mentioned in this connection that the aforementioned examples can further be modified on the basis of the technical concept of this invention.

For example, the shapes and materials of the aforementioned contacts and bases, etc., can be modified. In addition, the shape, material and construction of the cover (reciprocation member) can also be changed. In addition, an adaptor may be employed to cope with the IC packages of various shapes, forms and dimensions.

In the above examples, the IC package was inserted and fixed in the main socket body by changing the cover in the vertical direction. However, it does not have to be changed in the vertical direction only. For example, the cover may be changed in any suitable direction such as the horizontal direction, to cite an example.

It is mentioned that this invention can, of course, be applied to the electrical parts other than the aforementioned IC package.

We claim:

1. A socket adapted for mounting an electrical part with lead members for use in a burn-in test of said electrical part comprising a base member, resilient contact element means secured in said base member adapted to make contact with the lead members of said electrical part, a reciprocating cover means capable of reciprocating motion in respect to said base member, said reciprocating cover means having a cam means adapted to be in contact with said contact element means such that as said reciprocating cover means moves from a first position to a second position for mounting said electrical part, said cam means causes said contact element means also to move from a first original position to a second electrical part mounting position, and upon said reciprocal cover means returning to said original position said contact element also moving back to said original position from said second position thereby providing electrical contacting between said terminal lead members and said contact element means; and means formed within said base member for precisely guiding and positioning said electrical part during mounting in said socket and for holding said electrical part after mounting to ensure reliable contacting, said guiding and positioning means adapted to receive said electrical part which is a generally parallelepiped configuration with lead members being provided only on one side of the electrical part and including blind holes in the base member for receiving protrusions extending from the electrical part on the same side surface as the lead members during mounting of the electrical part.

2. A socket according to claim 1 wherein said guiding and positioning means comprises wall members in the base member for closely controlling the movement of at least two mutually facing surfaces of the electrical part.

3. The socket according to claim 1 wherein said electrical part has mutually facing top and bottom surfaces and two sets of mutually facing side surfaces with only one side of one of the sets of mutually facing side surfaces containing terminal leads and which is mounted in said socket with the side containing lead members entering the socket first for receipt by said guiding and positioning means.

4. The socket according to claim 3 wherein said reciprocating cover means has an opening therethrough and said electrical part is vertically mounted in said socket through said opening in said cover means.

5. The socket according to claim 3 wherein said electrical part is mounted at an angle of thirty degrees or less to vertical.

6. The socket according to claim 3 wherein said socket has a side wall in the base member with an opening therethrough and said electrical part is mounted horizontally in the socket through said opening in the side wall.

7. The socket according to claim 1 wherein said contact element means has a terminal portion extending from the base member, a contact portion for engaging said cam means and a curved lead holding portion for making contact with said lead member of said electrical part.

8. The socket according to claim 1 wherein said base member of said socket includes a mounting surface for receiving said electrical part and supporting said lead members when said electrical part is mounted in said socket.

9. The socket according to claim 8 wherein there are a plurality of thin partition walls extending from said mounting surface of said base member for preventing contact of adjacent contact element means.

10. A socket adapted for mounting an electrical part for use in a burn-in test of said electrical part, said electrical part of a generally parallelepiped configuration having mutually facing top and bottom surfaces and two sets of mutually facing side surfaces with contact lead members provided on only one side of one set of the two sets of mutually facing side surfaces, comprising a base member, resilient contact element means secured in said base member adapted to make contact with the lead members of said electrical part, a reciprocating cover means capable of reciprocating motion in respect to said base member, said reciprocating cover means having a cam means adapted to be in contact with said contact element means such that as said reciprocating cover means moves from a first position to a second position for mounting said electrical part said cam means causes said contact element means also to move from a first original position to a second electrical part mounting position, and upon said reciprocal cover means returning to said original position and contact element means also moving back to said original position from said second position thereby providing electrical contacting between said lead members and said contact element means and means formed within said base member for precisely guiding and positioning said electrical part during mounting of said electrical part in said socket and for holding said electrical part after mounting to ensure reliable contacting, said guiding, positioning and holding means including wall members in the base member for controlling the movement of at least two mutually facing surfaces of the electrical part, blind holes in the base member for receiving protrusions extending from the electrical part on the same side surface as the lead members, and mounting surface means in the base member for receiving said lead members.

11. A socket according to claim 10 wherein said reciprocating cover means has an opening therethrough and said electrical part is vertically mounted in said socket through said opening in said cover means.

12. A socket according to claim 10 wherein said electrical part is mounted at an angle of thirty degrees or less to vertical.

13. A socket according to claim 10 wherein said contact element means has a terminal portion extending from the base member, a contact portion for engaging said cam means and a curved lead holding portion for making contact with said lead member of said electrical part.

14. A socket according to claim 10 wherein there are a plurality of thin partition walls extending from said mounting surface of said base member for preventing contact of adjacent contact element means.

* * * * *